United States Patent
Noda (10) Patent No.: US 11,196,384 B2
(45) Date of Patent: Dec. 7, 2021

(54) POWER AMPLIFIER

(71) Applicant: NEC CORPORATION, Tokyo (JP)

(72) Inventor: Takashi Noda, Tokyo (JP)

(73) Assignee: NEC CORPORATION, Tokyo (JP)

( * ) Notice: Subject to any disclaimer, the term of this patent is extended or adjusted under 35 U.S.C. 154(b) by 38 days.

(21) Appl. No.: 16/792,955

(22) Filed: Feb. 18, 2020

(65) Prior Publication Data
US 2020/0304069 A1    Sep. 24, 2020

(30) Foreign Application Priority Data

Mar. 18, 2019   (JP) .............................. JP2019-049819

(51) Int. Cl.
*H03F 1/02* (2006.01)
*H03F 3/217* (2006.01)

(52) U.S. Cl.
CPC ......... *H03F 1/0205* (2013.01); *H03F 3/2171* (2013.01); *H03F 2200/171* (2013.01)

(58) Field of Classification Search
CPC . H03F 1/0205; H03F 3/2171; H03F 2200/171
USPC ....................................................... 330/251
See application file for complete search history.

(56) References Cited

U.S. PATENT DOCUMENTS

2013/0033118 A1*   2/2013   Karalis .................. H02J 50/50
                                                    307/104

FOREIGN PATENT DOCUMENTS

JP        06-036384 U    5/1994
JP        2002-158544 A  5/2002

* cited by examiner

*Primary Examiner* — Hafizur Rahman
(74) *Attorney, Agent, or Firm* — Sughrue Mion, PLLC (57) ABSTRACT

An example object of the present invention is to provide a power amplifier with better conversion efficiency.
The power amplifier including a power amplifier circuit that includes: a first switching element; a second switching element; a first capacitor; and a second capacitor. The first switching element is controlled by a first PWM signal generated from an input signal. The second switching element is controlled by a second PWM signal in a reverse phase to the first PWM signal. The first capacitor is a capacitor connected in parallel to the first switching element. The second capacitor is a capacitor connected in parallel to the second switching element.

16 Claims, 8 Drawing Sheets

POWER AMPLIFIER

CROSS-REFERENCE TO RELATED APPLICATIONS

This application claims priority based on Japanese Patent Application No. 2019-049819 filed on Mar. 18, 2019, the entire disclosure of which is incorporated herein.

BACKGROUND

Technical Field

The present invention relates to a power amplifier.

Background Art

PTL 1 discloses a power amplifier called a digital power amplifier (class-D amplifier). The digital power amplifier converts change in magnitude of input signals into a pulse width modulation (PWM) signal that represents the change by using change in a pulse width direction. The PWM signal is supplied to two switches that are connected in series between a power source and a ground. Power is directly supplied from the power source to a load.

PTL 2 describes elimination of power loss occurred when a first switching element is turned on. PTL 2 discloses that an inductance or a capacitor accumulates energy and the energy is used for flip of a switch.

[PTL 1] JP 2002-158544 A
[PTL 2] JP H06-36384 U

SUMMARY

Figure 8:
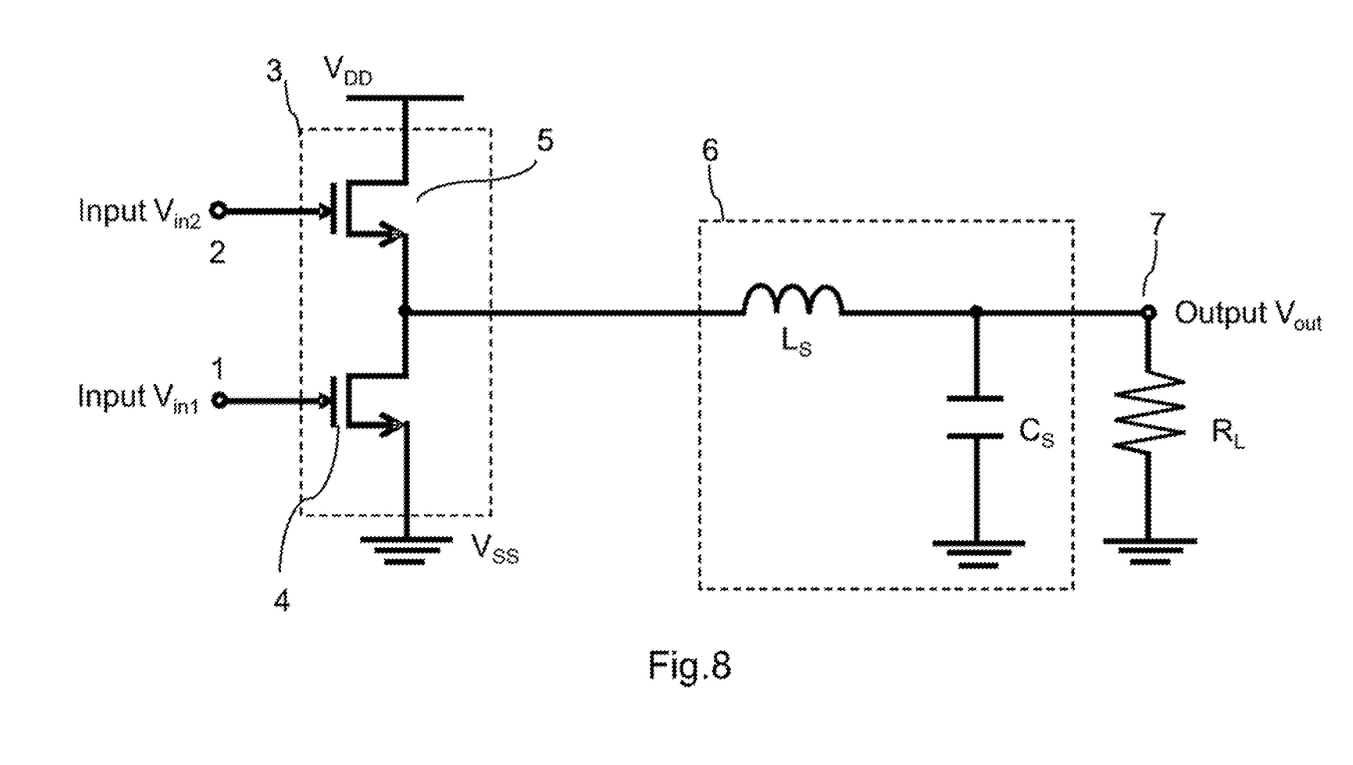
FIG. 8 is a diagram illustrating a configuration of a class-D switching power amplifier.

FIG. 8 is a diagram illustrating a configuration of an existing class-D switching power amplifier (digital power amplifier). With reference to FIG. 8, the normal class-D switching power amplifier includes two switching elements.

In the class-D switching power amplifier, input power is input to input terminals 1 and 2, and the power is supplied from an output terminal 7 to a load (a load resistor $R_L$). In addition, the class-D switching power amplifier includes a power amplifier circuit 3 and a filter circuit 6 disposed at a stage subsequent to the power amplifier circuit 3. The power amplifier circuit 3 includes a switching element 4 disposed at a lower stage and a switching element 5 disposed at an upper stage.

The filter circuit 6 functions as a low pass filter. The filter circuit 6 includes a coil $L_S$ and a capacitor $C_S$. For example, the two switching elements illustrated in FIG. 8 are N-channel metal-oxide-semiconductor field-effect transistor (MOSFET) elements.

In the switching elements, parasitic capacitance exists. The parasitic capacitance of the switching elements stores electric charge. The electric charge affects switching operation in a high operation frequency domain. Specifically, the parasitic capacitance of the switching elements makes it impossible for the class-D switching power amplifier to perform ideal amplification operation in the high operation frequency domain, and this results in reduction in conversion (power) efficiency.

From this point of view, the technology disclosed in PTL 1 is a technology for reducing a signal distortion component occurred in the output signal of the digital power amplifier, and it is impossible to prevent reduction in the conversion efficiency even if the technology is applied.

A main example object of the present invention is to provide a power amplifier with better conversion efficiency.

According to the present invention, there is provided a power amplifier including a power amplifier circuit that includes: a first switching element configured to be controlled by a first pulse width modulation (PWM) signal generated from an input signal; a second switching element configured to be controlled by a second PWM signal in a reverse phase to the first PWM signal; a first capacitor connected in parallel to the first switching element; and a second capacitor connected in parallel to the second switching element.

According to the present invention, it is possible to provide the power amplifier with better conversion efficiency. Note that the present invention may exert other effects instead of the above-described effect or together with the above-described effect.

DESCRIPTION OF THE EXAMPLE EMBODIMENTS

First, an overview according to an example embodiment will be described. Note that drawing reference signs related to the overview denote various elements for the sake of convenience and are used as examples to facilitate understanding of the present invention. Namely, the description of the overview is not intended to indicate any limitations. Note that, in the present specification and drawings, elements to which similar descriptions are applicable are denoted by the same reference signs, whereby overlapping descriptions may be omitted.

Figure 1:
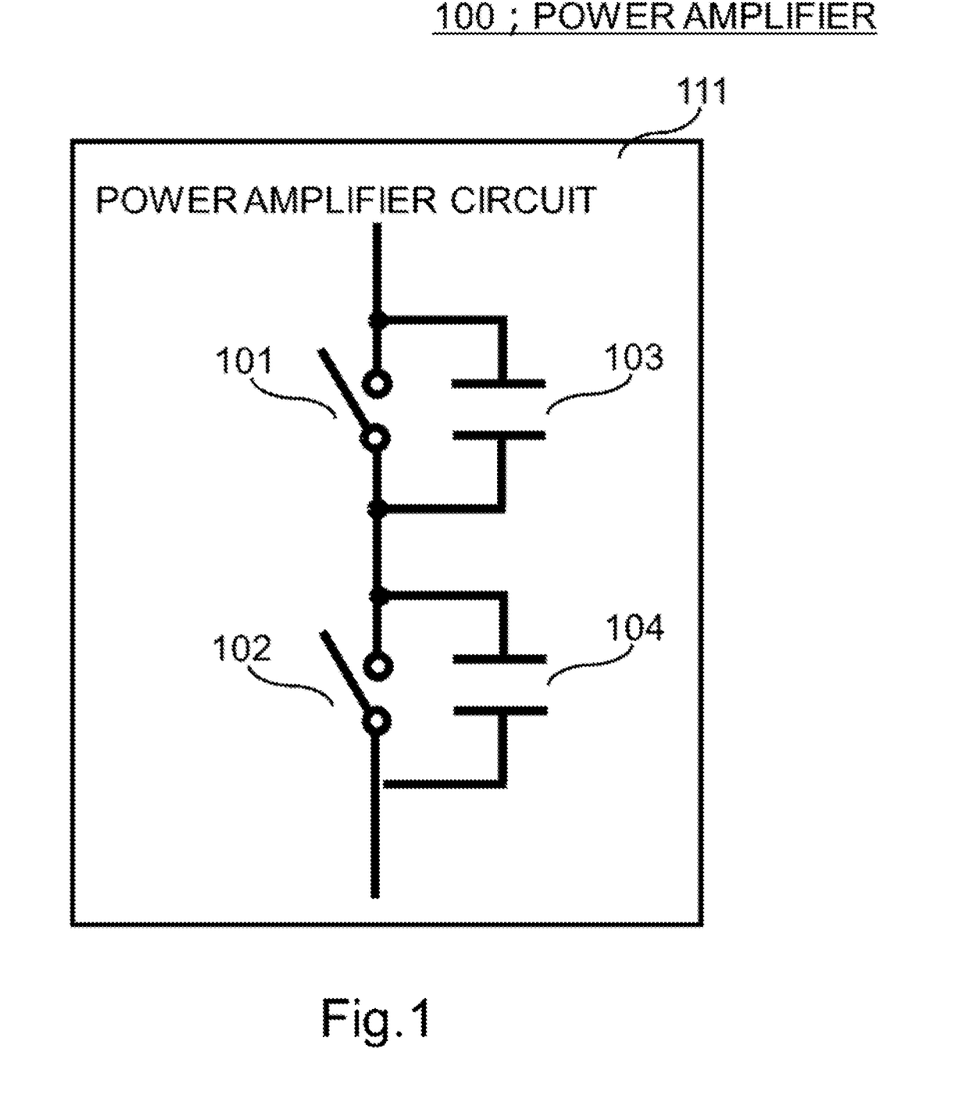
FIG. 1 is a diagram for describing an overview according to an example embodiment.

A power amplifier 100 according to an example embodiment includes a power amplifier circuit 111 including a first switching element 101, a second switching element 102, a first capacitor 103, and a second capacitor 104 (see FIG. 1). The first switching element 101 is controlled by a first PWM signal generated from an input signal. The second switching element 102 is controlled by a second PWM signal in reverse phase to the first PWM signal. The first capacitor 103 is a capacitor connected in parallel to the first switching element 101. The second capacitor 104 is a capacitor connected in parallel to the second switching element 102.

The power amplifier 100 includes the first and second capacitors 103 and 104 that are respectively attached in parallel to the first and second switching elements 101 and 102 serving as class-D hard-switching power amplifiers. Capacities of the capacitors are selected in a manner that impedance of a resonant circuit including the power amplifier circuit 111 becomes pure resistance. As a result, it is possible to eliminate reactive power of a load of the power amplifier 100, and improve conversion efficiency. In other words, the power amplifier 100 operates as class-D phase-correction power amplifier using parallel capacitors.

Next, specific example embodiments will be described in detail with reference to the drawings.

First Example Embodiment

A first example embodiment will be described in detail with reference to the drawings.

Figure 2:
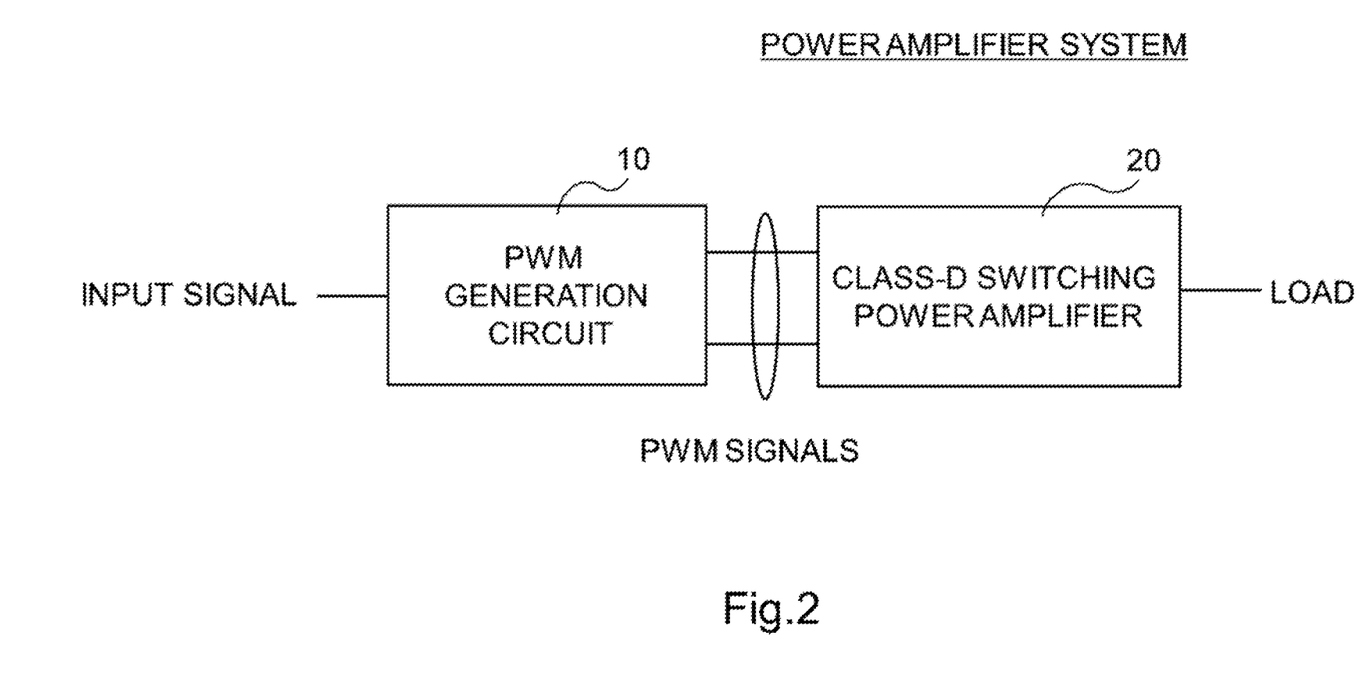
FIG. 2 is a diagram illustrating a configuration example of a power amplifier system according to a first example embodiment.

FIG. 2 is a diagram illustrating a configuration example of a power amplifier system according to the first example embodiment. With reference to FIG. 2, the power amplifier system includes a PWM generation circuit 10 and a class-D switching power amplifier 20.

The PWM generation circuit 10 is a circuit that converts an input signal into a PWM signal. The PWM generation circuit 10 generates the PWM signal to be used by the class-D switching power amplifier 20 for switching operation. More specifically, the PWM generation circuit 10 compares magnitude of the input signal (a modulated wave) with magnitude of a triangle wave (a carrier), and generates a PWM signal depending on a result of the comparison.

In the present disclosure, it is possible to use an existing PWM generation circuit as the PWM generation circuit 10. Therefore, detailed description thereof is omitted.

The PWM generation circuit 10 generates two positive and negative PWM signals and supplies the positive and negative PWM signals to the class-D switching power amplifier 20. More specifically, the PWM generation circuit 10 generates a PWM signal in a positive phase and a PWM signal in a reverse phase to the PWM signal in the positive phase, and supplies the PWM signals to the class-D switching power amplifier 20.

Figure 3:
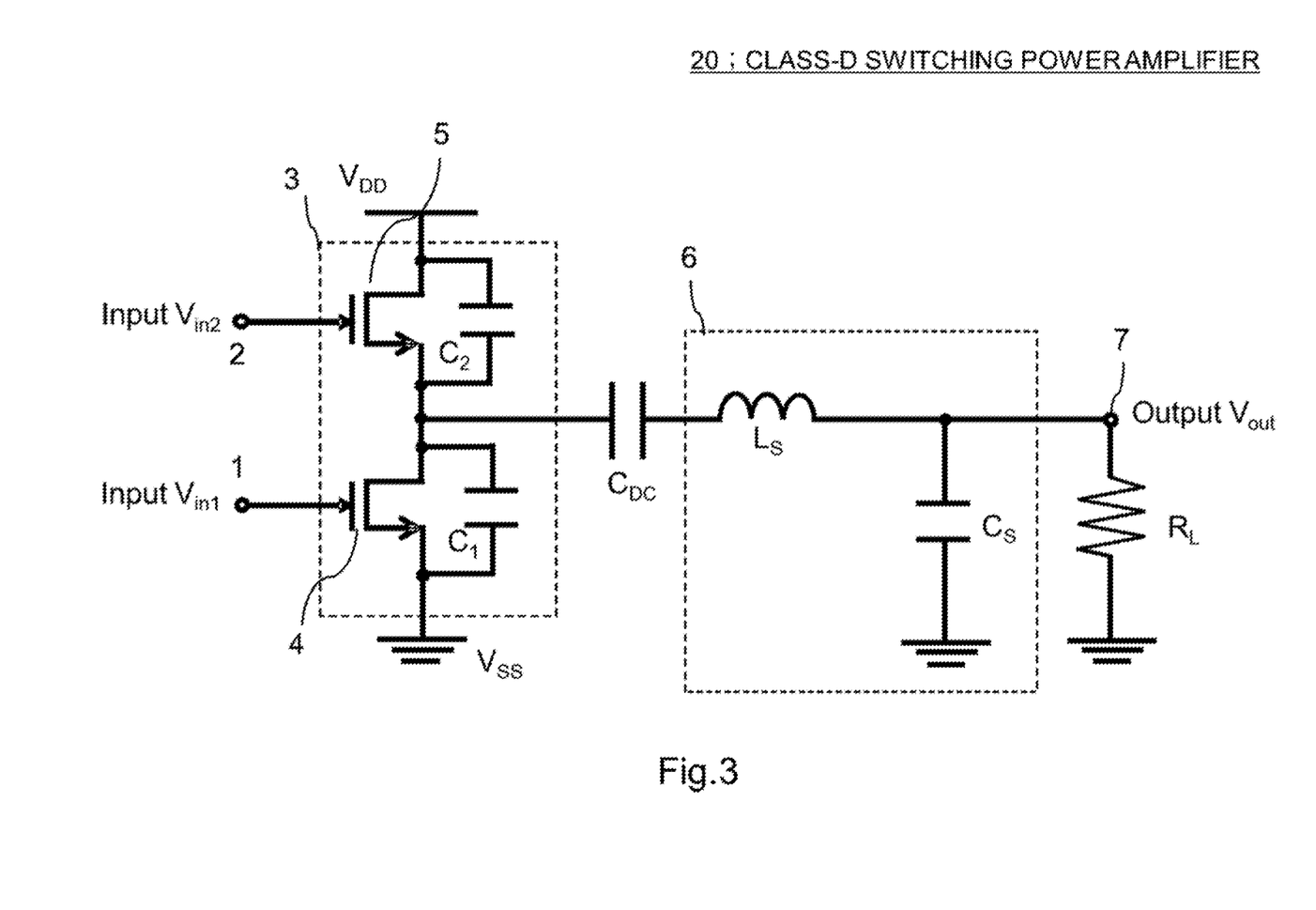
FIG. 3 is a diagram illustrating an example of a circuit configuration of a class-D switching power amplifier according to the first example embodiment.

FIG. 3 is a diagram illustrating an example of a circuit configuration of the class-D switching power amplifier 20 according to the first example embodiment. With reference to FIG. 3, the class-D switching power amplifier 20 includes a power amplifier circuit 3 and a filter circuit 6.

The power amplifier circuit 3 includes switching elements 4 and 5 and capacitors $C_1$ and $C_2$. For example, the switching elements 4 and 5 are N-channel MOSFETs. The switching elements 4 and 5 are connected in series between a power source $V_{DD}$ and a ground $V_{SS}$. Specifically, a drain of the switching element 5 is connected to the power source $V_{DD}$, and a source of the switching element 5 is connected to a drain of the switching element 4. A source of the switching element 4 is connected to the ground $V_{SS}$.

In addition, gates of the switching elements 4 and 5 are connected to respective input terminals 1 and 2 that receive input signals (Input $V_{in1}$ and Input $V_{in2}$).

For example, switching operation of the switching element 5 is controlled by the PWM signal in the positive phase, and switching operation of the switching element 4 is controlled by the PWM signal in the reverse phase.

The capacitor $C_1$ is connected in parallel to the switching element 4. Specifically, the drain and source of the switching element 4 are connected to respective electrodes of the capacitor $C_1$. The capacitor $C_2$ is connected in parallel to the switching element 5 in a similar way. The drain and source of the switching element 5 are connected to respective electrodes of the capacitor $C_2$. As described above, the capacitors $C_1$ and $C_2$ are connected in parallel to the switching elements 4 and 5. Therefore, hereinafter, these capacitors are referred to as "parallel capacitors".

The filter circuit 6 includes a capacitor $C_S$ and a coil $L_S$. The filter circuit 6 functions as a low pass filter that smoothes an output waveform of the power amplifier circuit 3. Note that, as described later, the filter circuit 6 functions as a part of a circuit that adjusts impedance of the class-D switching power amplifier 20 when viewed from the load side. In other words, the filter circuit 6 has a function of adjusting impedance (an impedance matching function).

As illustrated in FIG. 3, a capacitor $C_{DC}$ is connected between the power amplifier circuit 3 and the filter circuit 6. One end of the capacitor $C_{DC}$ is connected to an input terminal of the filter circuit 6 (a terminal of the coil $L_S$), and the other end of the capacitor $C_{DC}$ is connected to an output terminal of the power amplifier circuit 3.

As described later, the capacitor $C_{DC}$ plays a role in blocking direct current power (direct current voltage) supplied from the power amplifier circuit 3. Therefore, hereinafter, the capacitor $C_{DC}$ will be appropriately referred to as a "direct current blocking capacitor".

The other end of the coil $L_S$ included in the filter circuit 6 is connected to the capacitor $C_S$ and a load resistor $R_L$. One end of the capacitor $C_S$ is grounded (connected to the ground $V_{SS}$). A connection node of the coil $L_S$, capacitor $C_S$, and load resistor $R_L$ is an output node (an output terminal 7) of the class-D switching power amplifier 20. The output terminal 7 outputs an output signal Output $V_{out}$.

As described above, the capacitor $C_{DC}$ connected in series to the filter circuit 6 blocks (cuts) direct current voltage supplied from the power amplifier circuit 3. The capacitor $C_{DC}$ makes it possible to supply no direct current to an output resistor (the load resistor $R_L$) and prevent generation of heat therefrom. In other words, the capacitor $C_{DC}$ makes it possible to eliminate (reduce) loss when the power amplifier circuit 3 supplies direct current voltage.

Note that it is possible to define capacity of the capacitor $C_{DC}$ (the direct current blocking capacitor) on the basis of a frequency of a carrier used in the PWM generation circuit 10. Specifically, it is only necessary to select the capacity of the capacitor $C_{DC}$ from among capacities that allows a carrier frequency to pass through the capacitor.

The capacitor $C_1$ and $C_2$ (parallel capacitors) attached in parallel to the switching elements 4 and 5 play a role in canceling parasitic capacitances of the switching elements 4 and 5 at a specific frequency (in a specific frequency band). In addition, capacitances of the capacitors $C_1$ and $C_2$ are in the same phase as the filter circuit 6. Capacities thereof are determined in a manner that an impedance component of the class-D switching power amplifier 20 becomes pure resistance from the output side.

A way of determining the capacities of the capacitors $C_1$ and $C_2$ will be described later.

Next, operation of the class-D switching power amplifier 20 according to the first example embodiment will be described.

As described above, the positive and negative PWM signals are supplied to the class-D switching power amplifier 20. Specifically, an input signal (input voltage) in a positive phase is supplied to the input terminal 1, and an input signal (input voltage) in a reverse phase is supplied to the input terminal 2. The input powers are amplified by the switching elements 4 and 5 disposed at the lower and upper stages in the power amplifier circuit 3.

The input signals are considered as direct current signals (direct current voltages) or alternating current signals (alternating current voltages).

First, circuit operation performed in the case of inputting the direct current signals (operation performed at a time of direct current (DC)) will be described.

In this case, the direct current blocking capacitor is connected in series to the filter circuit 6. Therefore, the capacitor blocks direct current even if the power amplifier circuit 3 outputs a direct current signal. This makes it possible to suppress an electric current flowing through the load resistor $R_L$, and the resistor generates no power (consumes no power).

Next, circuit operation performed in the case of inputting the alternating current signals (operation performed at a time of alternating current (AC)) will be described.

In the case of the alternating current signals, the switching elements 4 and 5 in the power amplifier circuit 3 operate in different ways between the lower stage and the upper stage. At a specific timing, the switching element 4 is turned on but the switching element 5 is turned off. In addition, at a different timing from the specific timing, the switching element 4 is turned off but the switching element 5 is tuned on.

The above-described flip of the switching elements 4 and 5 makes it possible to configure a resonant circuit of the capacitors and the coil at a specific frequency with regard to the power amplifier circuit 3, the direct current blocking capacitor, and the filter circuit 6.

Figure 4:
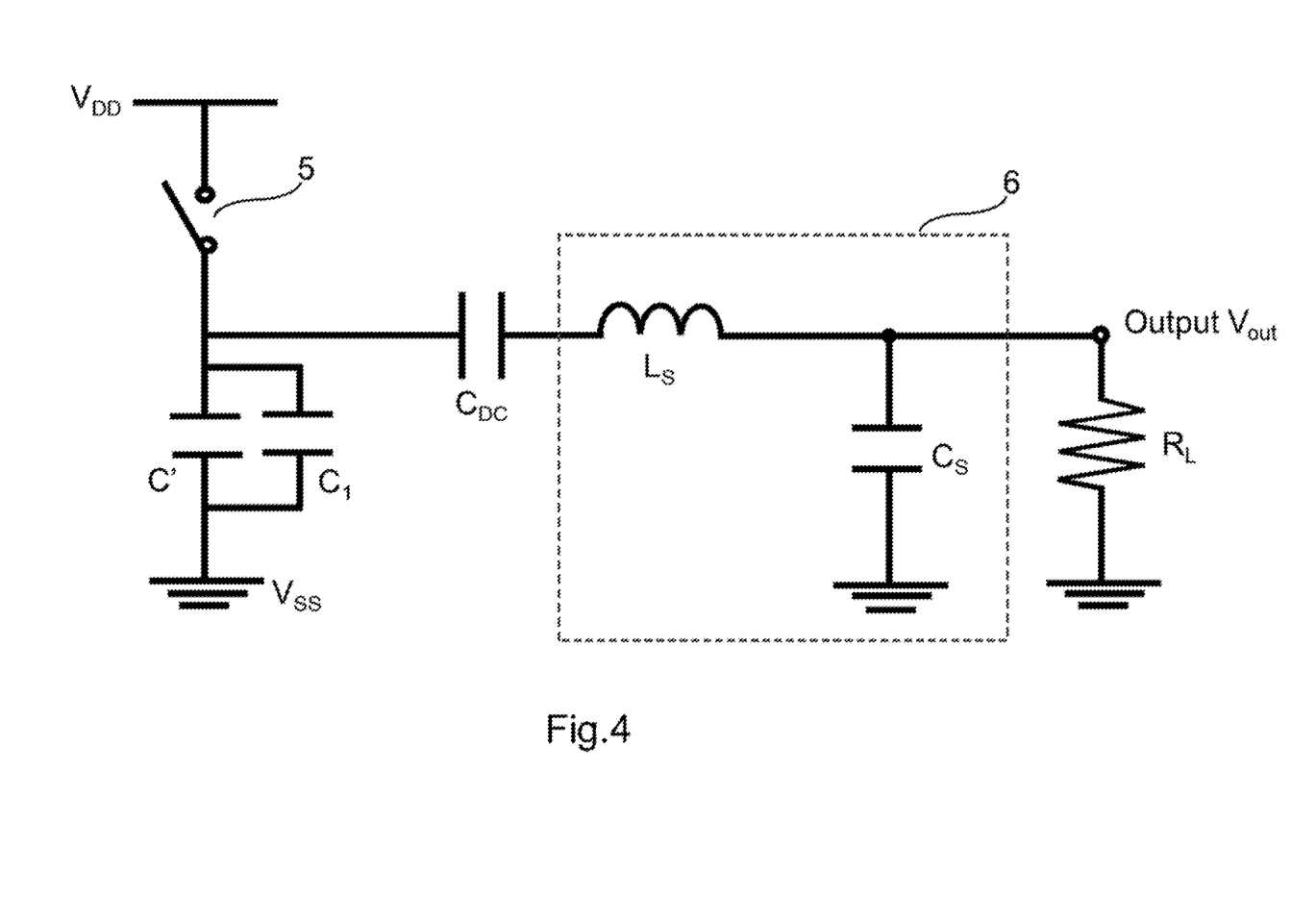
FIG. 4 is a diagram illustrating an example of an equivalent circuit of the class-D switching power amplifier according to the first example embodiment.

FIG. 4 is a diagram illustrating an example of an equivalent circuit of the class-D switching power amplifier 20 in the case where the switching element 4 is turned on but the switching element 5 is turned off. With reference to FIG. 4, the switching element 4 in the ON state is replaced with parasitic capacitance C'. The circuit illustrated in FIG. 4 may be replaced with a parallel resonant circuit illustrated in FIG. 5. In other words, it is possible to obtain the resonant circuit illustrated in FIG. 5 when the switching element 4 in the ON state is treated as a switch having capacitance.

Figure 5:
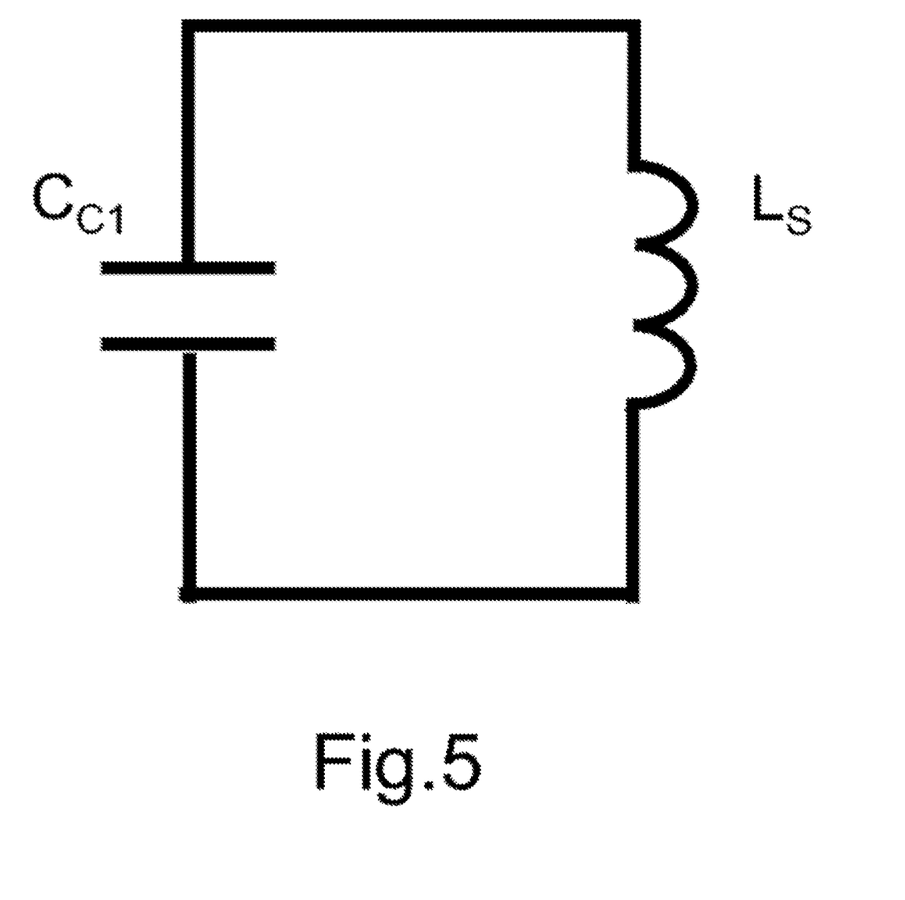
FIG. 5 is a diagram illustrating an example of a resonant circuit.

In FIG. 5, a coil $L_S$ mainly corresponds to an inductance component of the coil $L_S$ included in the filter circuit 6. A capacitor $C_{C1}$ is composite capacitance of the parasitic capacitance C' of the switching element 4 in the ON state, the capacitor $C_1$, the capacitor $C_{DC}$, and the capacitor $C_S$. Note that, although not illustrated in FIG. 5, the resonant circuit also includes a resistor component R.

Capacity of the capacitor $C_1$ is determined in a manner that an impedance component of the resonant circuit illustrated in FIG. 5 becomes pure resistance at a specific frequency (in a specific frequency band).

Here, a frequency band (fc) of an input signal is assumed to be the specific frequency selected when determining the capacity of the capacitor $C_1$. In other words, a frequency for operating the power amplifier circuit 3 including the switching element corresponds to the above-described specific frequency (frequency band).

The following equation (1) represents impedance of the parallel resonant circuit illustrated in FIG. 5.

[Math. 1]

$$\dot{Z} = \frac{\omega^2 RL^2}{(R - \omega^2 RLC)^2 + \omega^2 L^2} + j\frac{\omega R^2 L(1 - \omega^2 LC)}{(R - \omega^2 RLC)^2 + \omega^2 L^2} \quad (1)$$

In the equation (1), R represents resistance of the resistor component of the resonant circuit illustrated in FIG. 5, C represents capacity of the capacitor $C_{C1}$, and L represents inductance of the coil $L_S$. ω represents a resonance angular frequency.

In the equation (1), the impedance is considered as pure resistance in the case where an imaginary component is zero. Accordingly, the following equation (2) holds.

[Math. 2]

$$\frac{\omega R^2 L(1 - \omega^2 LC)}{(R - \omega^2 RLC)^2 + \omega^2 L^2} = 0 \quad (2)$$

In the equation (2), a numerator is zero, and ω is a positive value. This derives the following equation (3).

[Math. 3]

$$\omega = \frac{1}{\sqrt{LC}} \quad (3)$$

In the equation (3), L represents inductance of the coil $L_S$, C represents the composite capacitance of the parasitic capacitance C', capacitor $C_1$, capacitor $C_{DC}$, and capacitor $C_S$. In addition, ω is a value derivable from the specific frequency. Therefore, values other than the capacity of the capacitor $C_1$ in the equation (3) are known values, and it is possible to calculate the capacity of the capacitor $C_1$ by substituting the known values into the equation (3).

As described above, the capacity of the capacitor $C_1$ that is the parallel capacitor is defined based on impedance of the parallel resonant circuit including the capacitor $C_1$, the parasitic capacitance C' of the switching element 4, the direct current blocking capacitor, and the filter circuit 6. More specifically, the capacity of the capacitor $C_1$ is determined in a manner that an imaginary component of the impedance of the parallel resonant circuit becomes zero in the specific frequency band.

Figure 6:
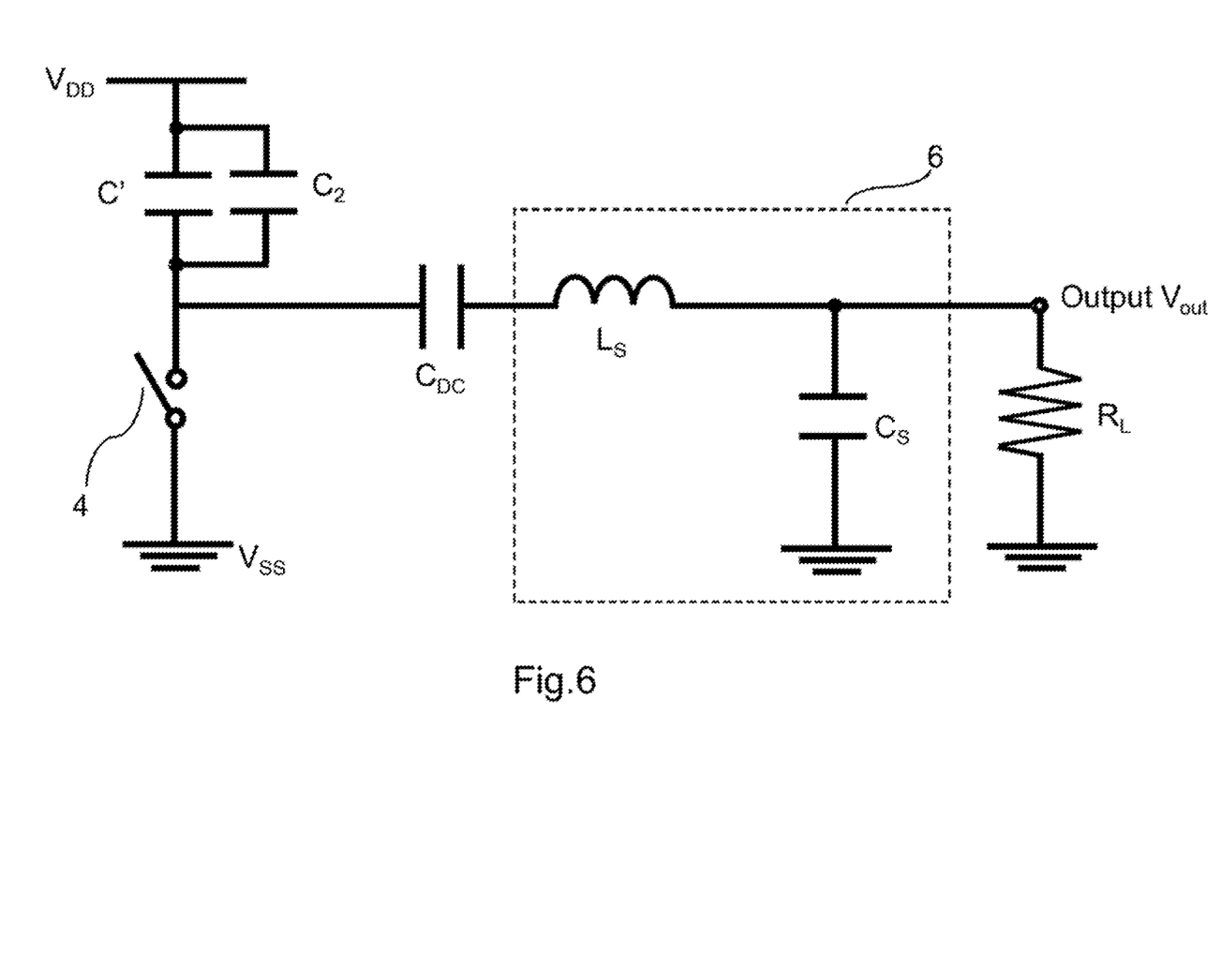
FIG. 6 is a diagram illustrating an example of the equivalent circuit of the class-D switching power amplifier according to the first example embodiment.

FIG. 6 is a diagram illustrating an example of an equivalent circuit of the class-D switching power amplifier 20 in the case where the switching element 4 is turned off but the switching element 5 is turned on. With reference to FIG. 6, the switching element 5 in the ON state is replaced with the parasitic capacitance C'. The circuit illustrated in FIG. 6 may be replaced with a series resonant circuit illustrated in FIG. 7.

Figure 7:
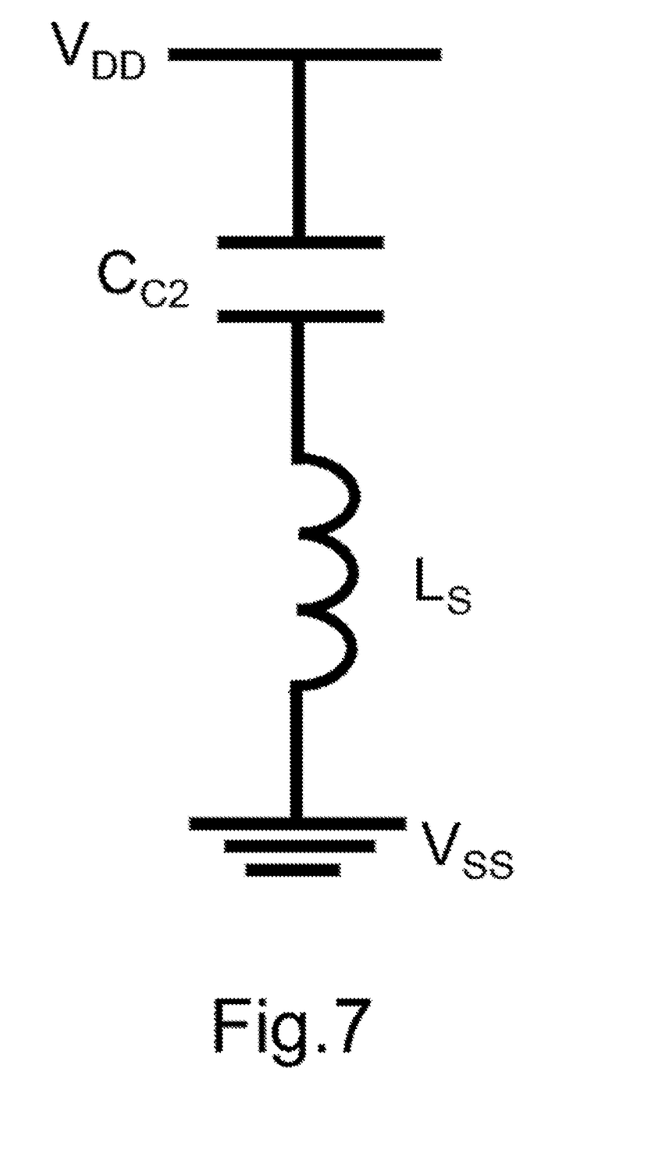
FIG. 7 is a diagram illustrating an example of the resonant circuit.

In FIG. 7, a coil $L_S$ mainly corresponds to an inductance component of the coil $L_S$ included in the filter circuit 6. A capacitor $C_{C2}$ is composite capacitance of the parasitic capacitance C' of the switching element 5 in the ON state, the capacitor $C_2$, the capacitor $C_{DC}$, and the capacitor $C_S$. Note that, although not illustrated in FIG. 7, the resonant circuit also includes a resistor component R.

Capacity of the capacitor $C_2$ is determined in a manner that an impedance component of the resonant circuit illustrated in FIG. 7 becomes pure resistance at a specific frequency (in a specific frequency band).

Here, in a way similar to the case of determining the capacity of the capacitor $C_1$, the frequency band (fc) of the input signal is assumed to be the specific frequency selected when determining the capacity of the capacitor $C_2$.

The following equation (4) represents impedance of the series resonant circuit illustrated in FIG. 7.

[Math. 4]

$$\dot{Z} = R + j\left(\omega L - \frac{1}{\omega C}\right) \quad (4)$$

In the equation (4), R represents resistance of the resistor component of the resonant circuit illustrated in FIG. 7, C represents capacity of the capacitor $C_{C2}$, and L represents inductance of the coil $L_S$. $\omega$ represents a resonance angular frequency.

In the equation (4), the impedance is considered as pure resistance in the case where an imaginary component is zero. Accordingly, the following equation (5) holds.

[Math. 5]

$$\omega L - \frac{1}{\omega C} = 0 \quad (5)$$

It is possible to derive the following equation (6) from the equation (5).

[Math. 6]

$$\omega = \frac{1}{\sqrt{LC}} \quad (6)$$

The equation (6) is the same as the equation (3). Even in the case of the series resonant circuit, capacities and the like of elements other than the capacitor $C_2$ are known values. Therefore, it is possible to find capacity of the capacitor $C_2$ from the equation (6).

As described above, the capacity of the capacitor $C_2$ is defined based on impedance of the series resonant circuit including the capacitor $C_2$, the parasitic capacitance C' of the switching element 5, the direct current blocking capacitor, and the filter circuit 6. More specifically, the capacity of the capacitor $C_2$ is determined in a manner that an imaginary component of the impedance of the series resonant circuit becomes zero in the specific frequency band.

According to the first example embodiment, capacities of the capacitors $C_1$ and $C_2$ in the case of AC operation are determined in a manner that impedance of the resonant circuit including the parasitic capacitance C', filter circuit 6, and the direct current blocking capacitor becomes pure resistance at a specific frequency. In other words, the capacities of the capacitors $C_1$ and $C_2$ are determined in a manner that impedances of the coil and the capacitors of the resonant circuit match each other. That is, the capacities of the capacitors $C_1$ and $C_2$ are determined in a manner that a resonant frequency of the resonant circuit (the parallel resonant circuit or the series resonant circuit) becomes a specific frequency (frequency band).

When the capacitances of the capacitors $C_1$ and $C_2$ are selected as described above, the filter circuit 6 and the parasitic capacitances of the switching elements 4 and 5 are in the same phase at the specific frequency. This makes it possible to treat output impedance as pure resistance. In other words, the class-D switching power amplifier 20 operates as an amplifier having pure resistance as the output impedance. As a result, no reactive power of the class-D switching power amplifier 20 is generated (the reactive power becomes zero) at the specific frequency.

As described above, in the first example embodiment, capacitors are attached in parallel to the switching elements 4 and 5. In addition, capacities of the capacitors are determined (selected) in a manner that impedance of the resonant circuit including the filter circuit 6 becomes pure resistance at a specific frequency in the case of the AC operation of the power amplifier circuit 3. In addition, the direct current blocking capacitor is interposed between the power amplifier circuit 3 and the filter circuit 6 in the class-D switching power amplifier 20. In other words, according to the first example embodiment, the capacitors are attached in parallel to the switching elements, and the direct current blocking capacitor is joined in series to the filter circuit 6. This results in cancellation of the parasitic capacitances of the switching elements 4 and 5 at a specific frequency, and the load behaves in a way similar to the pure resistance. The output impedance seems to be the pure resistance, and therefore the reactive power of the class-D switching power amplifier 20 becomes zero. Accordingly, unlike the related art, it is not necessary to improve the switching elements or process an amplified waveform after power amplification to amplify power with high efficiency.

In addition, if the above-described parallel capacitors are not used, the parasitic capacitances of the switching elements increase and ideal switching operation is not expected at a time of switching operation of the class-D switching power amplifier 20 at a high frequency. However, according to the present disclosure, the parallel capacitors are inserted depending on the parasitic capacitances of the switching elements 4 and 5, and this makes it possible to prevent inhibition of the above-described switching operation.

[Example Alteration]

The configuration and the like of the class-D switching power amplifier 20 according to the above example embodiment are a mere example, and this is not intended to indicate any limitation of the circuit configurations.

For example, it is also possible to connect a plurality of the power amplifier circuits 3 in cascade. In this case, the direct current blocking capacitors cut a direct current component, and this makes it possible to enhance the effects according to the present disclosure. In other words, it is possible to enhance the effects by adding the plurality of power amplifier circuits 3 to subsequent stages because output impedance seems to be zero at a specific frequency. Note that, in this case, only one load resistor is enough.

In the above example embodiment, the configuration including the direct current blocking capacitor has been described. However, the capacitor is not necessary in the case where a signal output from the power amplifier circuit 3 includes no direct current component or the direct current component is extremely small and can be ignored. Even in the case where the direct current blocking capacitor is not included, capacities of parallel capacitors may be determined in a manner that impedance of a resonant circuit seems to be pure resistance.

From the above description, industrial applicability of the present invention is explicit. The present invention can preferably be applied to any technical fields that require power amplification. For example, the present disclosure can be preferably applied to base stations, mobile phones, mobile communication devices, oscillators, and the like that require a radio frequency (RF) power amplifier.

Some or all of the above-described example embodiments can be described as in the following Supplementary Notes, but are not limited to the following.

(Supplementary Note 1)

A power amplifier comprising a power amplifier circuit (3, 111), the power amplifier circuit (3, 111) including:

a first switching element (5, 101) configured to be controlled by a first pulse width modulation (PWM) signal generated from an input signal;

a second switching element (4, 102) configured to be controlled by a second PWM signal in a reverse phase to the first PWM signal;

a first capacitor ($C_2$, 103) connected in parallel to the first switching element (5, 101); and a second capacitor ($C_1$, 104) connected in parallel to the second switching element (4, 102).

(Supplementary Note 2)

The power amplifier according to Supplementary Note 1, further comprising:

a filter circuit (6) configured to smooth output of the power amplifier (3, 111); and a third capacitor ($C_{DC}$) connected in series between the power amplifier (3, 111) and the filter circuit (6).

(Supplementary Note 3)

The power amplifier according to Supplementary Note 2, wherein capacity of the first capacitor ($C_2$, 103) is defined based on impedance of a series resonant circuit configured to include the first capacitor ($C_2$, 103), parasitic capacitance of the first switching element (5, 101), the third capacitor ($C_{DC}$), and the filter circuit (6).

(Supplementary Note 4)

The power amplifier according to Supplementary Note 3, wherein capacity of the first capacitor ($C_2$, 103) is determined so that an imaginary component of impedance of the series resonant circuit is zero in a specific frequency band.

(Supplementary Note 5)

The power amplifier according to any one of Supplementary Notes 2 to 4, wherein capacity of the second capacitor ($C_1$, 104) is defined based on impedance of a parallel resonant circuit configured to include the second capacitor ($C_1$, 104), parasitic capacitance of the second switching element (4, 102), the third capacitor ($C_{DC}$), and the filter circuit (6).

(Supplementary Note 6)

The power amplifier according to Supplementary Note 5, wherein capacity of the second capacitor ($C_1$, 104) is determined so that an imaginary component of impedance of the parallel resonant circuit is zero in a specific frequency band.

(Supplementary Note 7)

The power amplifier according to any one of Supplementary Notes 2 to 6, wherein capacity of the third capacitor ($C_{DC}$) is determined based on carrier frequency used to generate the first and second PWM signals.

(Supplementary Note 8)

The power amplifier according to any one of Supplementary Notes 1 to 7, comprising a plurality of the power amplifier circuits (3, 111).

(Supplementary Note 9)

The power amplifier according to Supplementary Note 2, wherein the filter circuit (6) is a low pass filter including a capacitor ($C_S$) and a coil ($L_S$).

(Supplementary Note 10)

The power amplifier according to any one of Supplementary Notes 1 to 9, wherein the first and second PWM signals are generated based on comparison result between magnitudes of an input signal and a carrier.

(Supplementary Note 11)

The power amplifier according to any one of Supplementary Notes 1 to 10, wherein the first and second switching elements (5, 101; 4, 102) are connected in series between a power source and a ground.

(Supplementary Note 12)

The power amplifier according to any one of Supplementary Notes 1 to 11, wherein the first and second switching elements (5, 101; 4, 102) are MOSFETs.

Though example embodiments of the present invention have been described above, the present invention is not limited to these example embodiments. It will be understood by those of ordinary skill in the art that these example embodiments are illustrative only and that various alterations can be done without departing from the scope and spirit of the present invention.

What is claimed is:

1. A power amplifier comprising a power amplifier circuit, the power amplifier circuit including:
   a first switching element configured to be controlled by a first pulse width modulation (PWM) signal generated from an input signal;
   a second switching element configured to be controlled by a second PWM signal in a reverse phase to the first PWM signal;
   a first capacitor connected in parallel to the first switching element;
   a second capacitor connected in parallel to the second switching element;
   a filter circuit configured to smooth output of the power amplifier; and
   a third capacitor connected in series between the power amplifier and the filter circuit,
   wherein capacity of the first capacitor is defined based on impedance of a series resonant circuit configured to include the first capacitor, parasitic capacitance of the first switching element, the third capacitor, and the filter circuit.

2. The power amplifier according to claim 1, wherein the filter circuit is a low pass filter including a capacitor and a coil.

3. The power amplifier according to claim 1, wherein the first and second PWM signals are generated based on comparison result between magnitudes of the input signal and a carrier.

4. The power amplifier according to claim 1, wherein the capacity of the first capacitor is determined so that an imaginary component of impedance of the series resonant circuit is substantially zero in a specific frequency band.

5. The power amplifier according to claim 1, wherein the first and second switching elements are connected in series between a power source and a ground.

6. The power amplifier according to claim 1, wherein the first and second switching elements are MOSFETs.

7. The power amplifier according to claim 1, wherein capacity of the third capacitor is determined based on carrier frequency used to generate the first and second PWM signals.

8. The power amplifier according to claim 1, comprising a plurality of the power amplifier circuits.

9. A power amplifier comprising a power amplifier circuit, the power amplifier circuit including:
   a first switching element configured to be controlled by a first pulse width modulation (PWM) signal generated from an input signal;

a second switching element configured to be controlled by a second PWM signal in a reverse phase to the first PWM signal;

a first capacitor connected in parallel to the first switching element;

a second capacitor connected in parallel to the second switching element;

a filter circuit configured to smooth output of the power amplifier; and a third capacitor connected in series between the power amplifier and the filter circuit, wherein capacity of the second capacitor is defined based on impedance of a parallel resonant circuit configured to include the second capacitor, parasitic capacitance of the second switching element, the third capacitor, and the filter circuit.

10. The power amplifier according to claim 9, wherein the capacity of the second capacitor is determined so that an imaginary component of impedance of the parallel resonant circuit is substantially zero in a specific frequency band.

11. The power amplifier according to claim 9, wherein the first and second switching elements are connected in series between a power source and a ground.

12. The power amplifier according to claim 9, wherein the first and second switching elements are MOSFETs.

13. The power amplifier according to claim 9, wherein capacity of the third capacitor is determined based on carrier frequency used to generate the first and second PWM signals.

14. The power amplifier according to claim 9, comprising a plurality of the power amplifier circuits.

15. The power amplifier according to claim 9, wherein the filter circuit is a low pass filter including a capacitor and a coil.

16. The power amplifier according to claim 9, wherein the first and second PWM signals are generated based on comparison result between magnitudes of the input signal and a carrier.

* * * * *